US012787466B2

(12) United States Patent
Wu et al.

(10) Patent No.: US 12,787,466 B2

(45) Date of Patent: Nov. 3, 2026

(54) IMAGE SENSING MODULE MANUFACTURING METHOD

(71) Applicant: Medimaging Integrated Solution, Inc., Hsinchu (TW)

(72) Inventors: Shangyi Wu, Hsinchu (TW); Chu-Ming Cheng, Hsinchu (TW); Hsin-Hsien Hsieh, Hsinchu (TW)

(73) Assignee: Medimaging Integrated Solution, Inc., Hsinchu (TW)

( * ) Notice: Subject to any disclaimer, the term of this patent is extended or adjusted under 35 U.S.C. 154(b) by 301 days.

(21) Appl. No.: 18/748,992

(22) Filed: Jun. 20, 2024

(65) Prior Publication Data

US 2025/0006756 A1 Jan. 2, 2025

(30) Foreign Application Priority Data

Jun. 30, 2023 (TW) ................................ 112124668

(51) Int. Cl.
*H10F 39/00* (2025.01)

(52) U.S. Cl.
CPC ......... *H10F 39/804* (2025.01); *H10F 39/024* (2025.01); *H10F 39/028* (2025.01); *H10F 39/8063* (2025.01); *B29K 2995/0026* (2013.01)

(58) Field of Classification Search
CPC ........ H04N 23/54; H04N 23/55; H04N 23/57; B29K 2995/0026; H10F 39/804; H10F 39/024; H10F 39/028; H10F 39/8063
See application file for complete search history.

(56) References Cited

U.S. PATENT DOCUMENTS

| | | | | | |
|---|---|---|---|---|---|
| 9,525,002 | B2 * | 12/2016 | Wong | H10F 39/024 | |
| 11,438,488 | B2 * | 9/2022 | Polak | G02B 7/028 | |
| 2007/0108577 | A1 * | 5/2007 | Tu | H10F 39/024 | 257/680 |
| 2007/0272827 | A1 * | 11/2007 | Heo | H04N 23/57 | 250/239 |
| 2007/0296847 | A1 * | 12/2007 | Chang | G02B 7/021 | 348/340 |
| 2008/0121784 | A1 * | 5/2008 | Chang | H04N 23/54 | 348/E5.028 |
| 2015/0116588 | A1 * | 4/2015 | Ferraris | G02B 7/08 | 348/373 |
| 2024/0130045 | A1 * | 4/2024 | Wu | H05K 1/18 | |

* cited by examiner

*Primary Examiner* — Alexander G Ghyka

(74) *Attorney, Agent, or Firm* — MUNCY, GEISSLER, OLDS & LOWE, P.C.

(57) ABSTRACT

An image sensing module manufacturing method includes steps: forming a mold and then disposing a plurality of lenses into a barrel of the mold; after confirming the position of the plurality of lenses, adhesively combining the plurality of lenses; installing an image sensor inside the barrel; fixing the image sensor after confirming the position relationship between the plurality of lenses and the image sensor; and cutting the mold to obtain a plurality of image sensing modules.

24 Claims, 25 Drawing Sheets

IMAGE SENSING MODULE MANUFACTURING METHOD

BACKGROUND OF THE INVENTION

1. Field of the Invention

The present invention relates to image sensing modules, particularly to an image sensing module manufacturing method.

2. Description of the Prior Art

FIG. 1 shows a conventional image sensing module. FIG. 2 shows the sectional view of the image sensing module shown in FIG. 1. The image sensing module 10 shown in FIG. 1 and FIG. 2 includes a barrel 12, a transparent protection layer 14, a plurality of lenses 16, 18 and 20, an image sensor 22, and a substrate 24. The barrel 12 and the image sensor 22 are fixed to the substrate 24, and the image sensor 22 is disposed inside the barrel 12. The plurality of lenses 16, 18 and 20 is fixed inside the barrel 12 and used to focus light on the image sensor 22. The transparent protection layer 14 is used to protect the plurality of lenses 16, 18 and 20. While the image sensing module 10 is assembled, the relative positions of the plurality of lenses 16, 18 and 20 with respect to the image sensor 22 may be adjusted to make the image sensor 22 obtain optimized images. After the image sensor 22 obtains optimized images, the relative positions of the plurality of lenses 16, 18 and 20 with respect to the image sensor 22 are fixed. Thereby, the image sensing module 10 can generate images of better quality.

However, the image sensing module 10 has a larger outer diameter. The LED light sources (not shown in the drawings) plus the image sensing module 10 would make the endoscope have too big a tip. Thus, the image sensing module 10 is unsuitable to be used in a small-size endoscope.

FIGS. 3-5 shows another conventional method for fabricating an image sensing module. As shown in FIG. 3, a plurality of image sensors 322 is fabricated on a wafer 32. The image sensor 322 is a wafer level package sensor. Next, a lens substrate 24 having a plurality of wafer level lenses 342, a lens substrate 36 having a plurality of wafer level lenses 362, and a lens substrate 38 having a plurality of wafer level lenses 382 are stacked over the wafer 32 and aligned to the plurality of image sensors 322 of the wafer 32. After alignment, the wafer 32, the lens substrate 34, the lens substrate 36 and the lens substrate 38 are adhesively combined.

After the wafer 32, the lens substrate 34, the lens substrate 36 and the lens substrate 38 have been adhesively combined, a transparent protection layer 40 is added to the lens substrate 34. Next, the combination of wafer and lens substrates is cut to obtain a plurality of image sensing modules 30, as shown in FIG. 4. Then, a black or dark-color light shield layer 42 is coated on the cut surfaces of the image sensing module 30 to prevent stray light from entering the image sensing module 30 lest the image quality be affected, as shown in FIG. 5. Because the image sensing module 30 is a wafer level one, it is smaller in size and applicable to a small-size endoscope.

As the image sensors 322 and the lens modules (including the lenses 342, 362 and 382) are fabricated in a wafer level package process, they are very tiny and hard to fabricate/assemble. Therefore, the image sensing module using the abovementioned wafer level elements has a lower yield and a higher price.

Besides, the abovementioned wafer level package process cannot align the lenses 342, 362 and 382 to the image sensors 322 but can only use alignment marks to align the lens substrates 34, 36 and 38. Then, the lens substrates 34, 36 and 38 are adhesively fixed in such a status. Therefore, the conventional technology cannot optimize the image quality. In other words, the imaging quality of the image sensing module 30 is hard to control. Such a problem further lowers the yield. Moreover, the wafer level package process cannot examine whether the image sensor 322 is damaged. Although a portion of image sensors 322 have been found damaged, the manufacturer cannot help but can only package the whole wafer 32. This situation further increases the cost.

Furthermore, the optical parameters of the image sensing module 30, such as field of view and depth of field, are fixed after fabrication. There is no room to vary them in usage. The image sensing modules 30 are unable to satisfy requirements of different endoscopes. If the manufacturer intends to alter the design of the image sensing module 30, he would spend much money in redesigning the mold of the wafer level lenses. Therefore, the cost of the image sensing module 30 is far higher than the cost of the image sensing module 10.

SUMMARY OF THE INVENTION

One objective of the present invention is to provide an image sensing module manufacturing method.

According to one embodiment of the present invention, the image sensing module manufacturing method comprises Step A: forming a mold, wherein the mold includes a plurality of barrels, and each barrel has a first hole and a second hole, which are opposite to each other and interconnect with each other; Step B: disposing a plurality of lenses in each of the barrels; Step C: installing an image sensor in the first hole of each barrel, wherein the image sensor is a chip-scale-package element; the plurality of lenses is used to focus light on the image sensor; and Step D: cutting the mold to obtain a plurality of image sensing modules, wherein each image sensing module includes the image sensor.

According to another embodiment of the present invention, the image sensing module manufacturing method comprises Step A: forming a mold, wherein the mold includes a plurality of barrels, and each barrel has a first hole and a second hole, which are opposite to each other and interconnect with each other; Step B: disposing a plurality of lenses in each of the barrels; Step C: cutting the mold to obtain a plurality of lens modules; and Step D: installing an image sensor in each of the lens modules to form an image sensing module, wherein the image sensor is a chip-scale-package element; the plurality of lenses is used to focus light on the image sensor.

According to yet another embodiment of the present invention, the image sensing module manufacturing method comprises Step A: forming a mold, wherein the mold includes a plurality of assembly areas; each assembly area has a barrel and a through-hole; each barrel has a first hole and a second hole, which are opposite to each other and interconnect with each other; Step B: disposing a plurality of lenses in each of the barrels; Step C: disposing an element module in each of the assembly areas, wherein the element module includes an image sensor and a light-emitting element; the image sensor is a chip-scale-package element and disposed inside the first hole; the light-emitting element is disposed inside the through-hole; the plurality of lenses is used to focus light on the image sensor; Step D: filling a first resin material into the through-hole of each assembly area to cover the light-emitting element, wherein the first resin material is a transparent resin material; and Step E: cutting the mold to obtain a plurality of image sensing modules, wherein each image sensing module includes the element module.

The objective, technologies, features and advantages of the present invention will become apparent from the following description in conjunction with the accompanying drawings wherein certain embodiments of the present invention are set forth by way of illustration and example.

BRIEF DESCRIPTION OF THE DRAWINGS

The foregoing conceptions and their accompanying advantages of this invention will become more readily appreciated after being better understood by referring to the following detailed description, in conjunction with the accompanying drawings, wherein.

DESCRIPTION OF THE PREFERRED EMBODIMENTS

Figure 2:
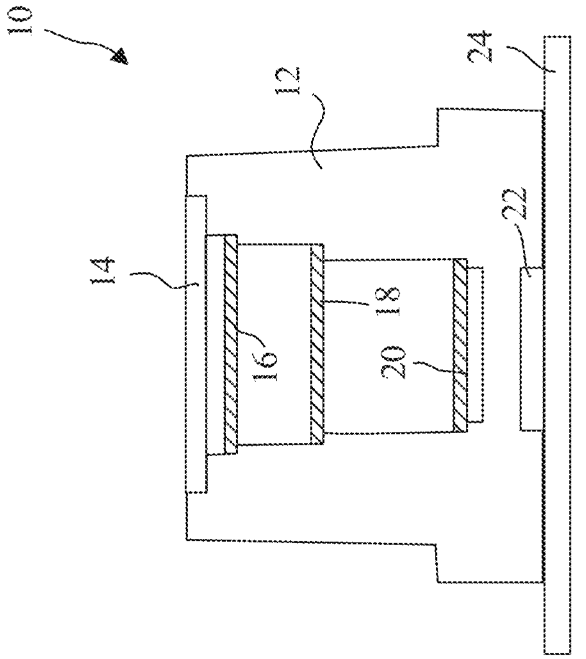
Fig. 2 (Prior Art)
FIG. 2 shows the sectional view of the image sensing module shown in FIG. 1.
Figure 1:
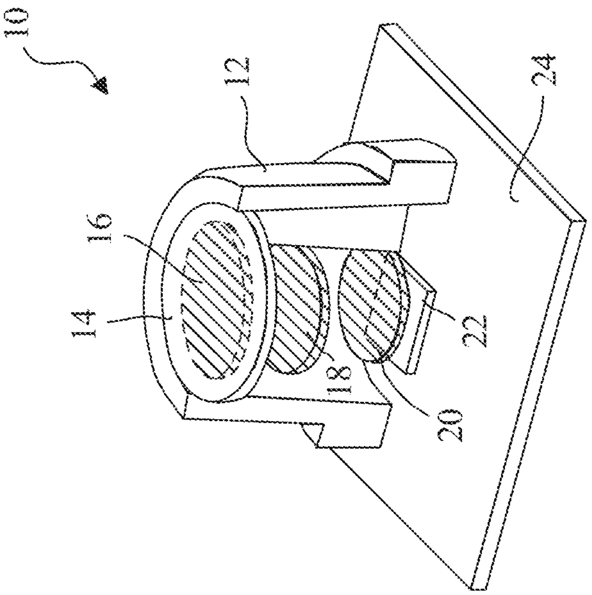
Fig. 1 (Prior Art)
FIG. 1 shows a conventional image sensing module.
Figure 3:
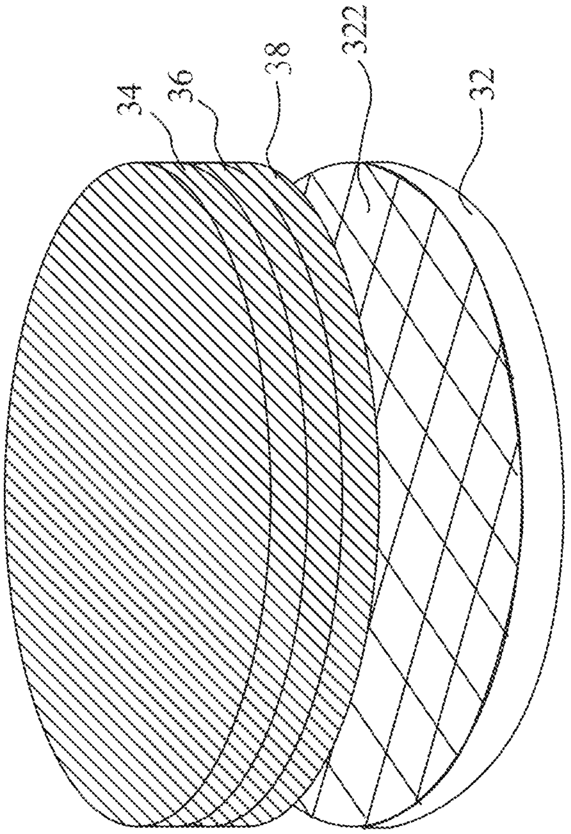
Fig. 3 (Prior Art)
FIGS. 3-5 shows a method for fabricating another conventional image sensing module.
Figure 5:
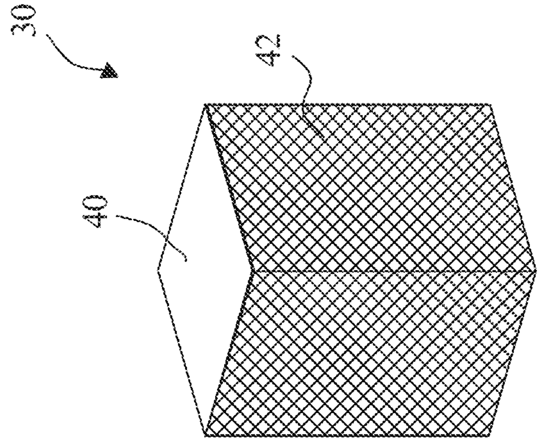
Fig. 5 (Prior Art)
Figure 4:
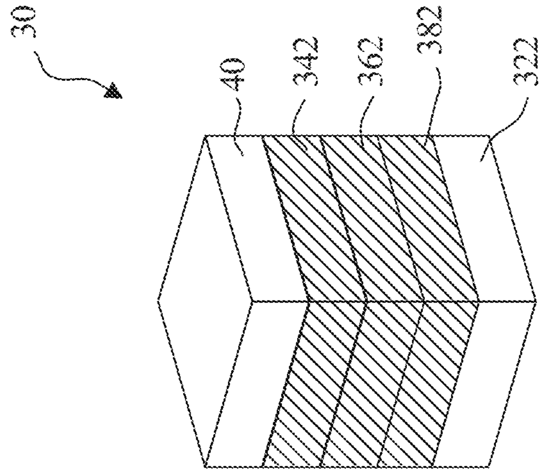
Fig. 4 (Prior Art)

The embodiments of the present invention will be further demonstrated in details hereinafter in cooperation with the corresponding drawings. In the drawings and the specification, the same numerals represent the same or the like elements as much as possible. For simplicity and convenient labelling, the shapes and thicknesses of the elements may be exaggerated in the drawings. It is easily understood: the elements belonging to the conventional technologies and well known by the persons skilled in the art may be not particularly depicted in the drawings or described in the specification. Various modifications and variations made by the persons skilled in the art according to the contents of the present invention are to be included by the scope of the present invention.

Figure 6:
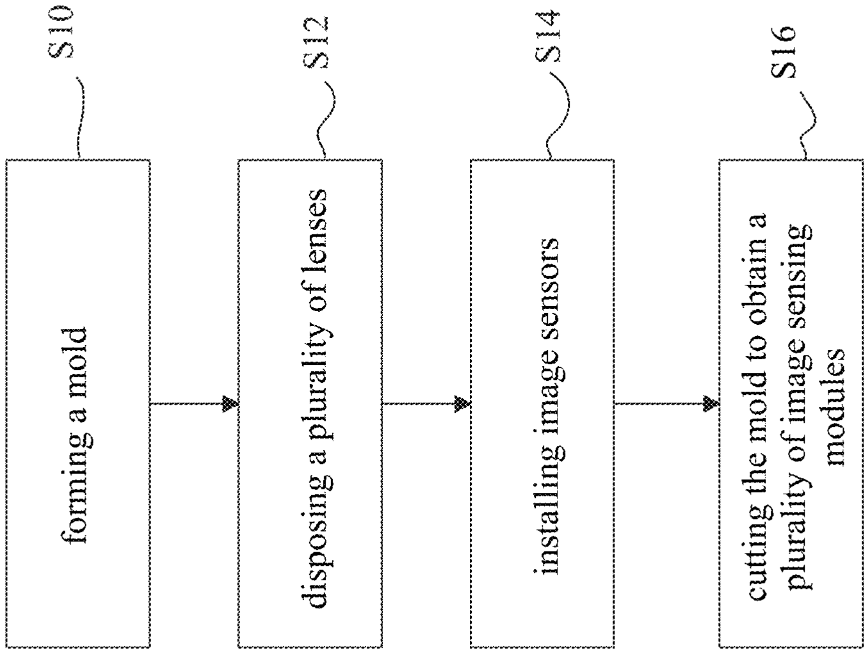
FIG. 6 is a flowchart showing an image sensing module manufacturing method according to a first embodiment of the present invention.
Figure 7:
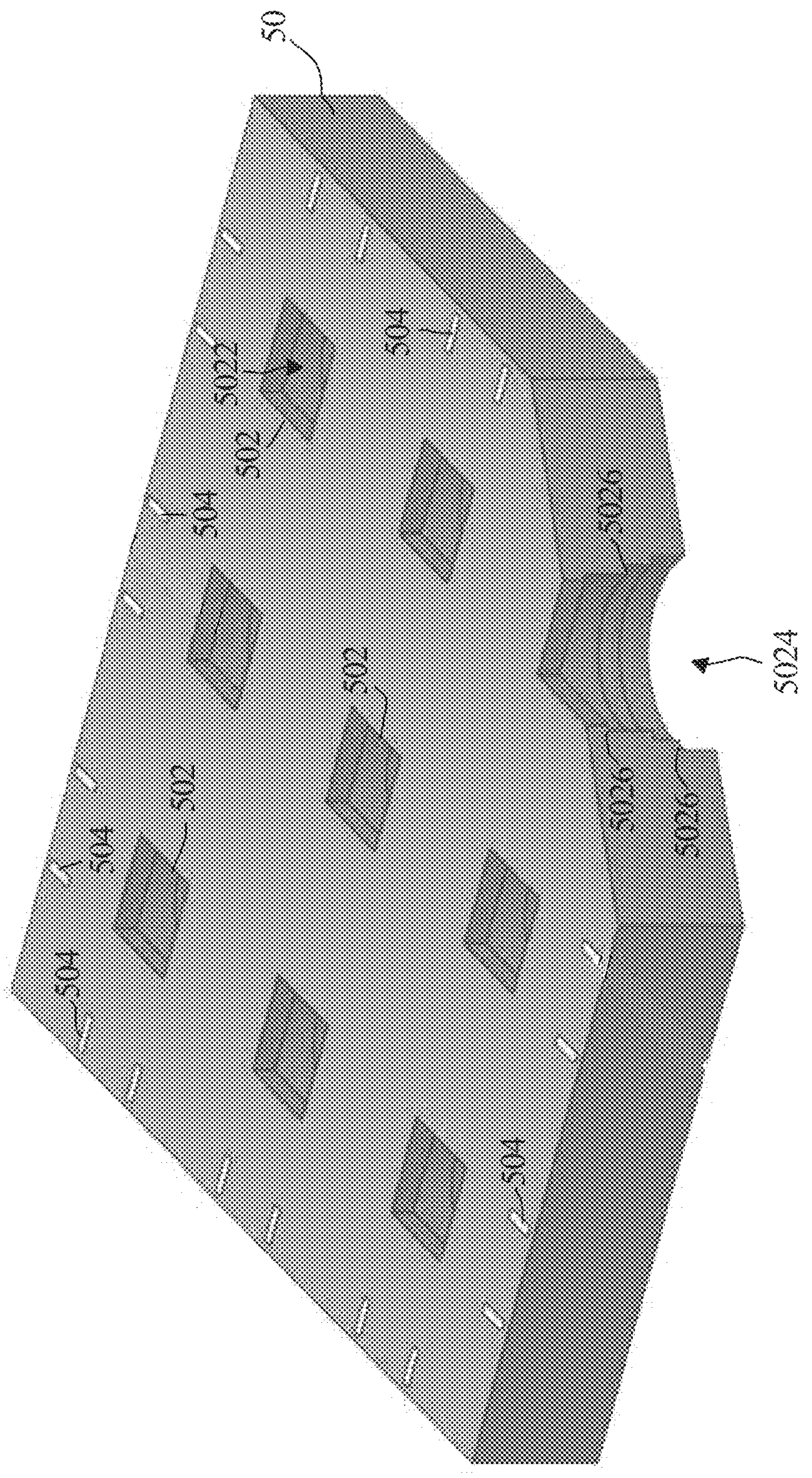
FIG. 7 is a perspective view schematically showing a first embodiment of the mold.

FIG. 6 is a flowchart showing an image sensing module manufacturing method according to a first embodiment of the present invention. In Step S10, form a mold 50 firstly. The mold 50 may be but is not limited to be produced in a mold-injection method. Refer to FIG. 7. The mold 50 includes a plurality of barrels 502. Each barrel 502 has a first hole 5022 and a second hole 5024, which are opposite to each other and interconnect with each other. The barrel 502 also has a plurality of support structures 5026 thereinside. The present invention does not particularly limit the shape of the barrel 502 but allows the shape of the barrel 502 to be a regular shape (such as a circular or rectangular shape) or an irregular shape. The mold 50 also has alignment marks 504, which are used in the following cutting process for alignment.

Figure 8:
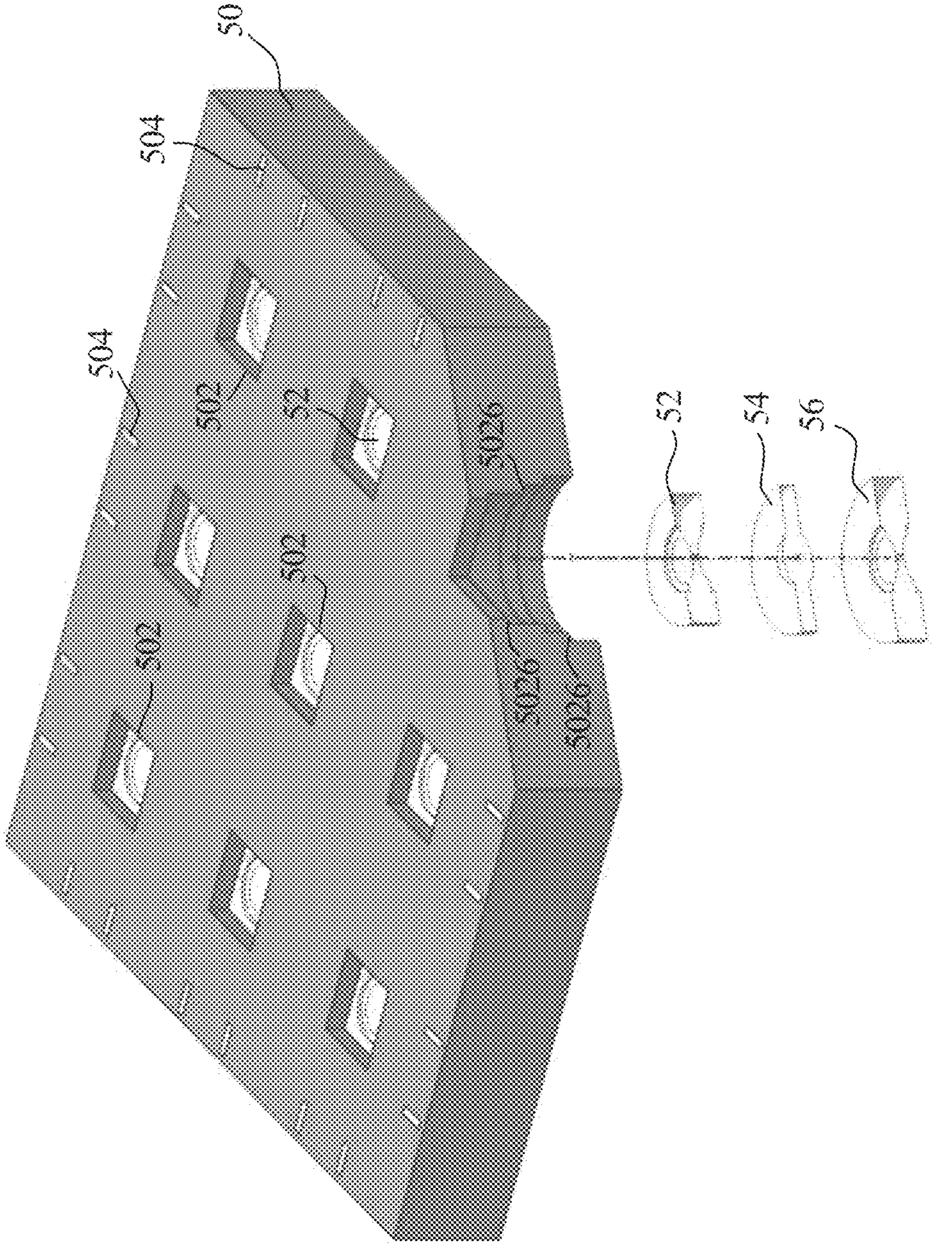
FIG. 8 is a perspective view schematically showing that lenses are disposed inside the mold shown in FIG. 7.

Refer to FIG. 8. Next, in Step S12, dispose a plurality of lenses 52, 54 and 56 inside the barrel 502, and use a resin material to adhesively secure the lenses 52, 54 and 56 inside the barrel 502. The lenses 52, 54 and 56 may respectively have different sizes and may be adhesively secured to different support structures 5026. In the embodiment, three lenses are placed in each barrel 502. However, the present invention does not limit the number of the lenses in each barrel 502. The number of the lenses in each barrel may be varied according to requirement.

Figure 9:
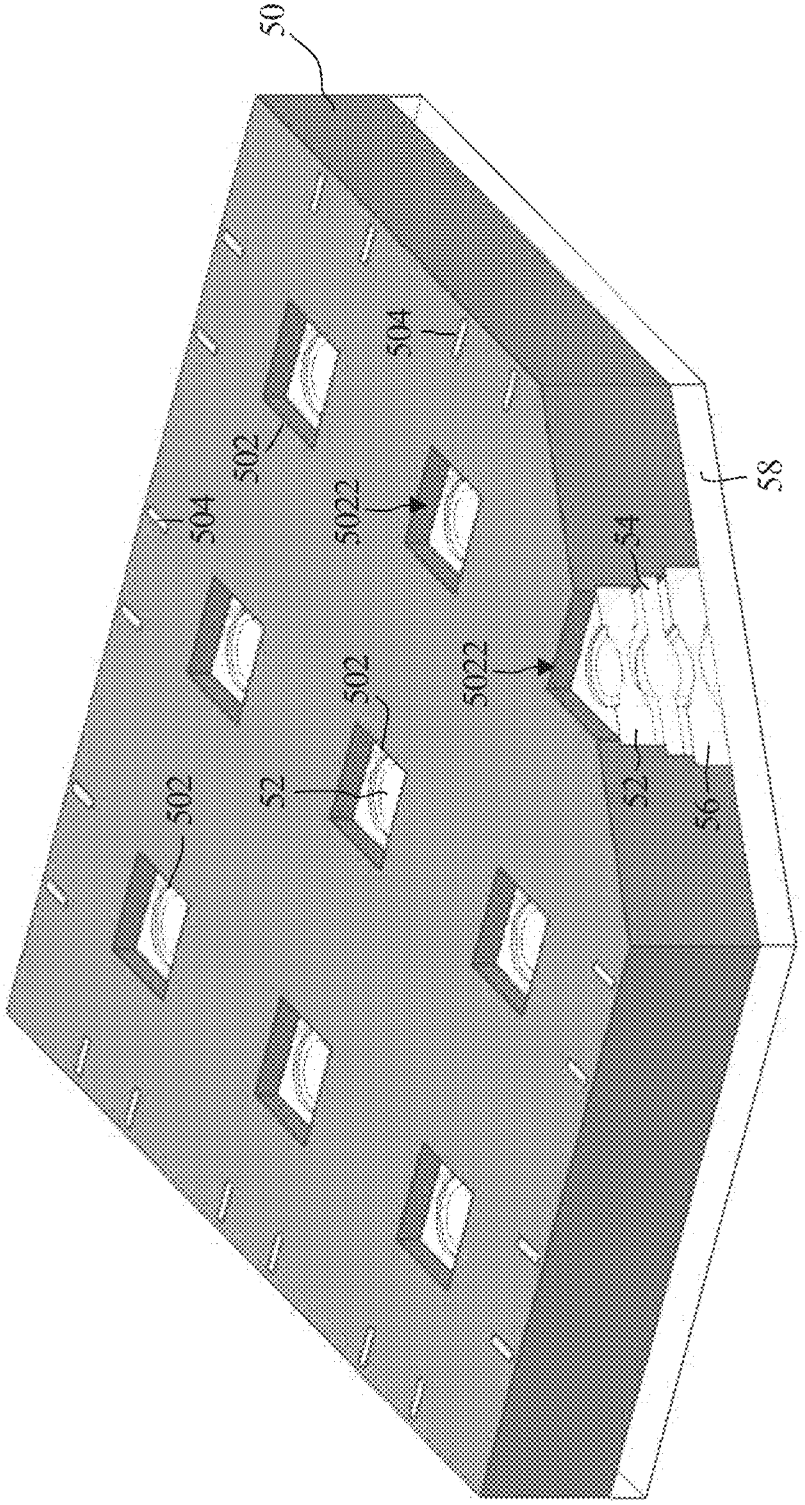
FIG. 9 is a perspective view schematically showing that a transparent protection layer is formed on the mold.

Refer to FIG. 9. After the lenses 52, 54 and 56 have been installed, a transparent protection layer 58 is formed on one side of the mold 50 to cover the second holes 5024 of the barrels 502. The transparent protection layer 58 is used to protect the surface. In one embodiment, the transparent protection layer 58 may be but is not limited to be a piece of flat glass. The flat glass may be a piece of glass coated with an anti-reflection film. In another embodiment, the transparent protection layer 58 may be omitted.

Figure 10:
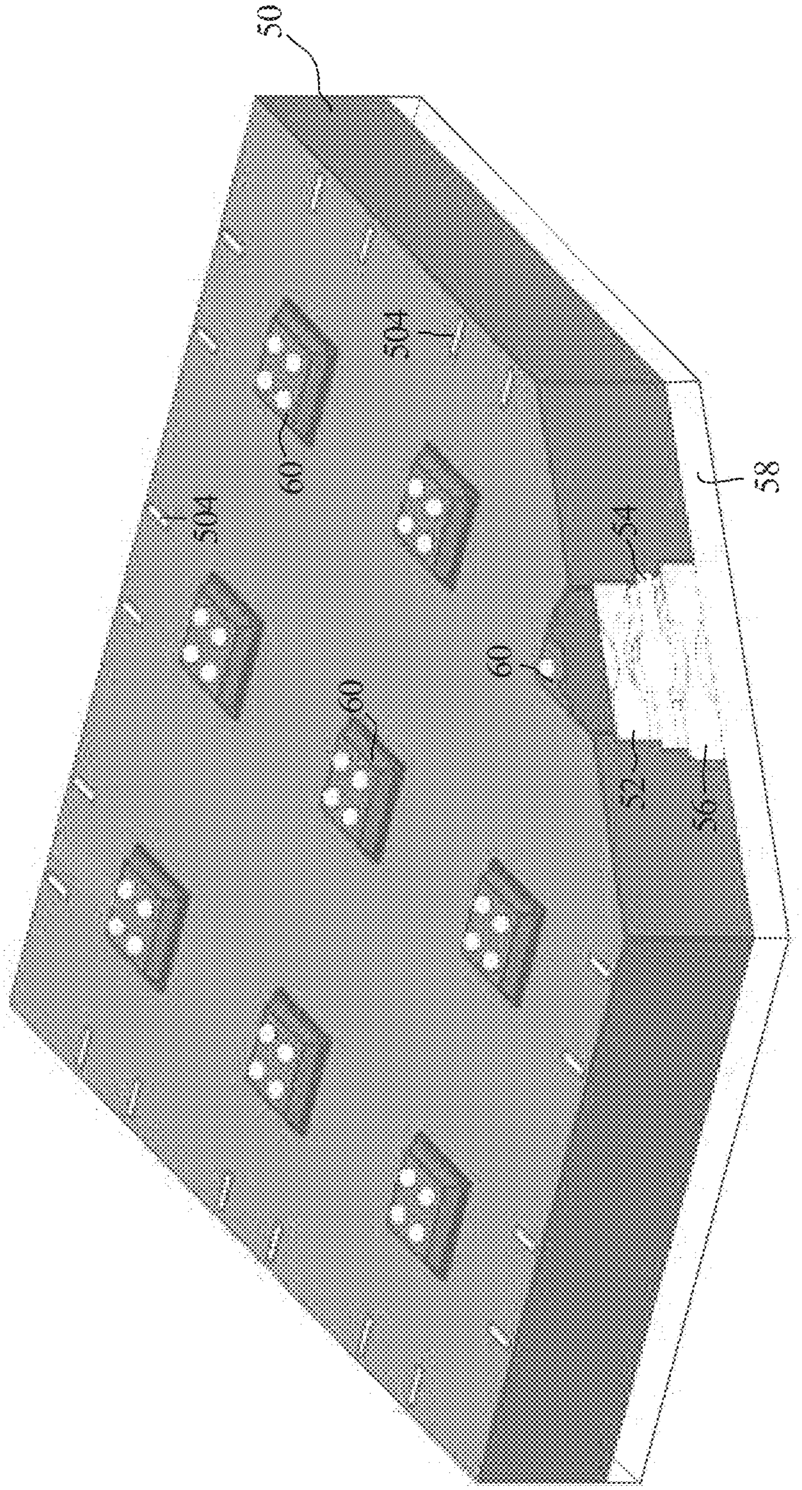
FIG. 10 is a perspective view schematically showing that image sensors are disposed in the first holes of the barrels.

After the transparent protection layer 58 has been formed, the process proceeds to Step S14. Refer to FIG. 10. In Step S14, install an image sensor 60 in the first hole 5022 of each barrel 502. The image sensor 60 is a chip-scale-package (CPS) element. The image sensor 60 may be secured to the barrel 502 with a resin. The plurality of lenses 52, 54 and 56 inside the barrel 502 may focus light on the image sensor 60. In the embodiment shown in FIG. 9 and FIG. 10, the method of the present invention forms the transparent layer 58 firstly and then disposes the image sensor 60. However, the method of the present invention may dispose the image sensor 60 firstly and then forms the transparent protection layer 58 in another embodiment.

Figure 12:
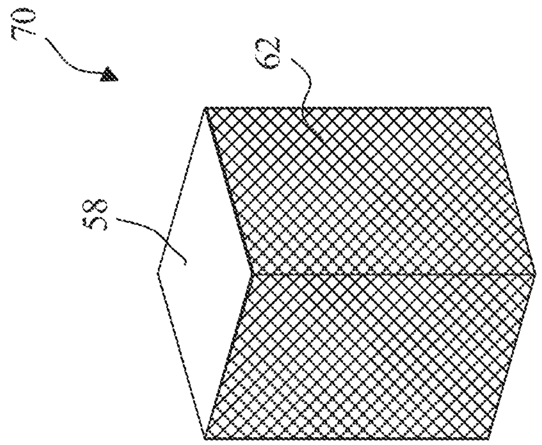
FIG. 12 is a diagram schematically showing an image sensing module coated with a light-shielding layer.
Figure 11:
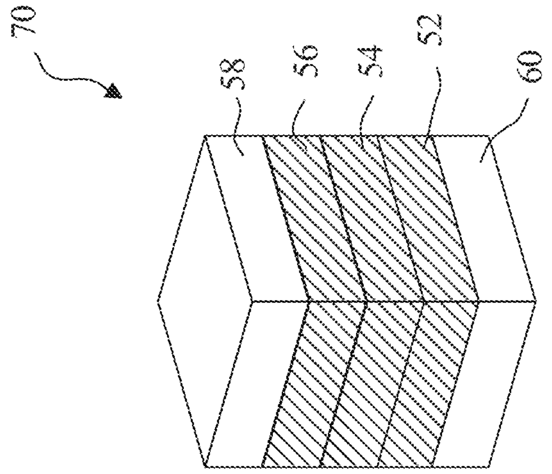
FIG. 11 is a diagram schematically showing an image sensing module.

After the image sensor 60 has been installed, the process proceeds to Step S16. Refer to FIG. 11. In Step S16, perform cutting according to alignment marks 504 on the mold 50 so as to obtain a plurality of image sensing modules 70. Refer to FIG. 12. Then, coat or cover the cut surfaces of the image sensing module 70 with a light-shielding layer 62 to prevent stray light from entering the image sensing module 70 lest the image quality be affected.

It is unnecessary for the method of the present invention to use a wafer-level package process to fabricate the lenses 52, 54 and 56. Therefore, the difficulty of fabricating lenses is decreased in the present invention. Thus, the yield of products is raised, and the cost is lowered, in the present invention. Further, the image sensing module manufacturing method of the present invention can control the relative positions of the image sensor 60 and the lenses 52, 54 and 56. Thus, the present invention can optimizes the image quality and further raise the yield. In the method of the present invention, whether the image sensor 60 is damaged may be examined before the image sensor 60 is disposed in the first hole 5022 of the barrel 502. Thus, it is guaranteed that the image sensor 60 of each image sensing module 70 is fine. Hence, the yield is raised furthermore.

Figure 14:
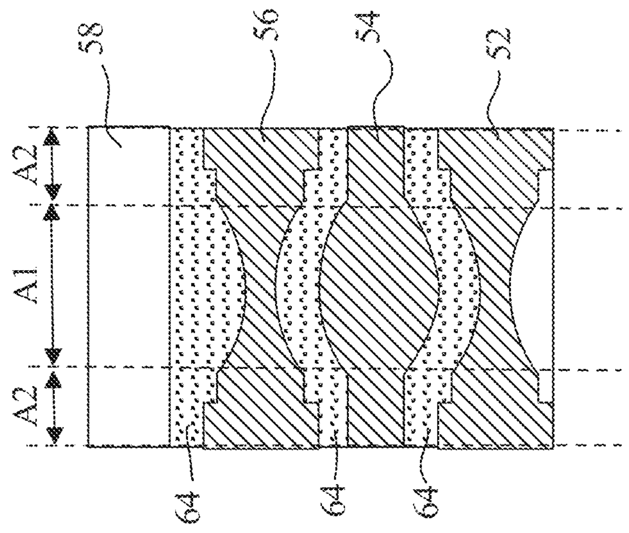
FIG. 14 is a sectional view schematically showing a second embodiment of using resin material to secure the lenses.
Figure 13:
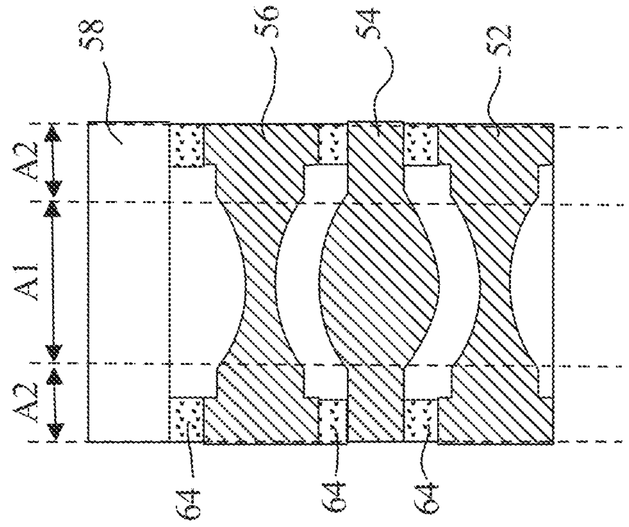
FIG. 13 is a sectional view schematically showing a first embodiment of using resin material to secure the lenses.

FIG. 13 shows a first embodiment of using resin material to secure the lenses 52, 54 and 56. In FIG. 13, a resin material 64 is coated on the non-imaging areas A2 on the perimeter of the lenses 52, 54 and 56. FIG. 14 shows a second embodiment of using resin material to secure the lenses 52, 54 and 56. In FIG. 14, a resin material 64 is coated on the imaging areas A1 of the lenses 52, 54 and 56 and the non-imaging areas A2 on the perimeter of the lenses 52, 54 and 56. In the embodiment shown in FIG. 14, the resin material 64 is a transparent resin material.

Figure 15:
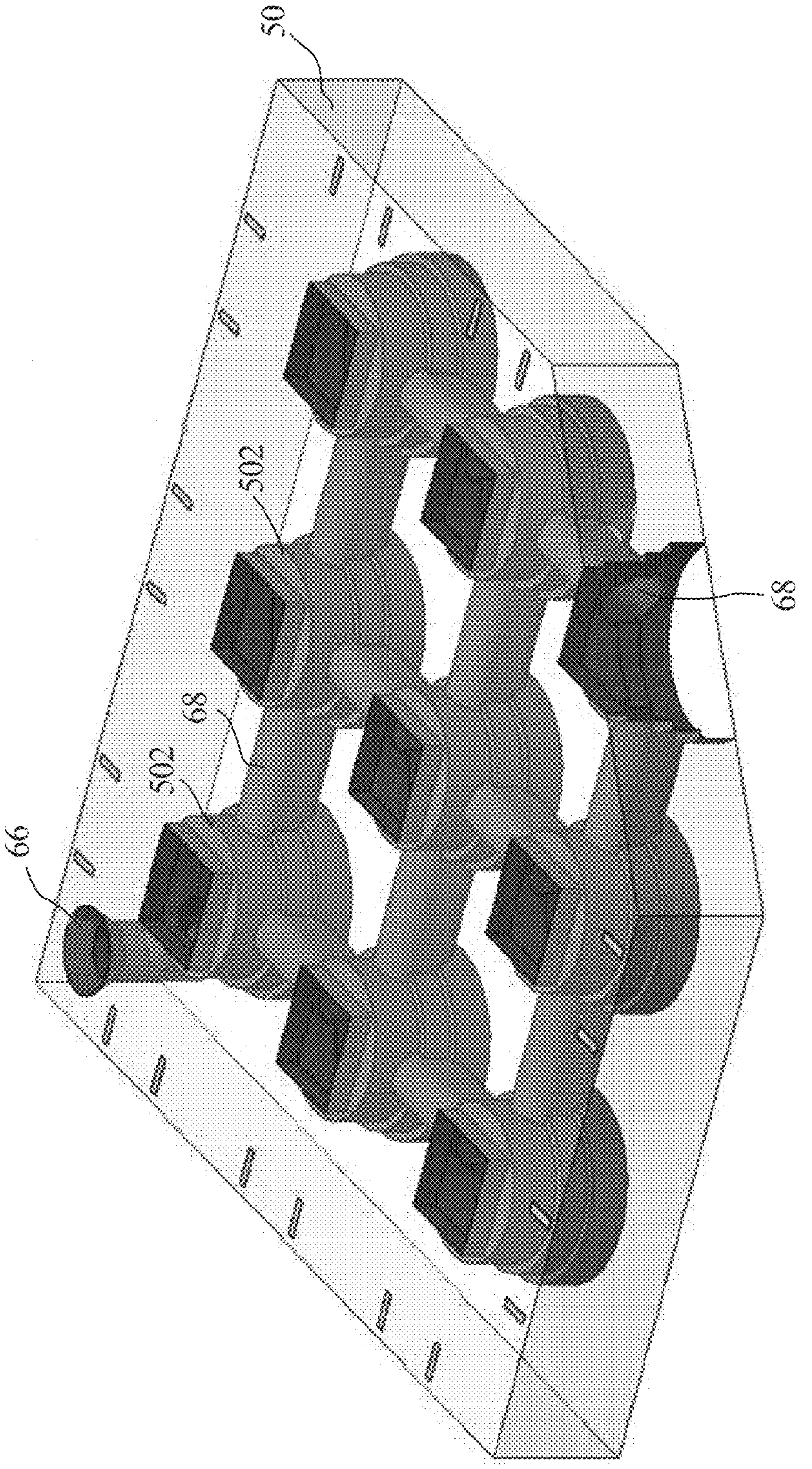
FIG. 15 is a perspective view schematically showing a second embodiment of the mold.

FIG. 15 shows another embodiment of the mold. In FIG. 15, in addition to the plurality of barrels 502 formed in the mold 50, a gate 66 is formed on the surface of the mold 50, and a runner 68 is also formed inside the mold 50. The runner 68 connects the gate 66 with the plurality of barrels 502. The shape, size and connection method of the runner 68 may be adjusted according to requirement. In the present invention, the position, size and number of the gates 66 are not particularly limited but may be adjusted according to the practical condition of resin filling and the quality of resin securing. Refer to FIG. 8. After the lenses 52, 54 and 56 have been disposed inside the barrel 502, a resin material 64 is filled into the plurality of barrels 502 through the gate 66 and the runner 68, whereby to adhesively secure the lenses 52, 54 and 56 in each barrel 502.

Figure 16:
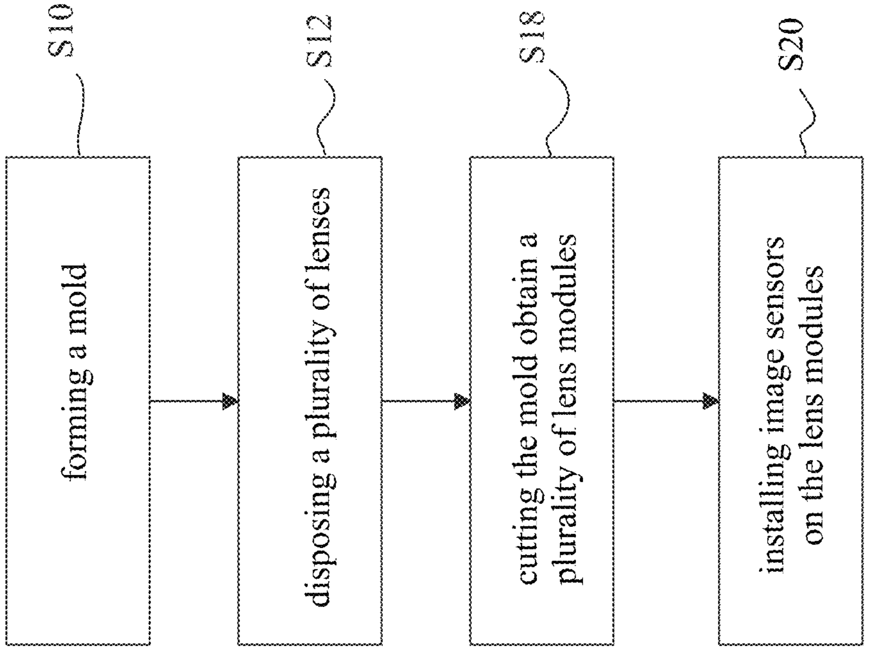
FIG. 16 is a flowchart showing an image sensing module manufacturing method according to a second embodiment of the present invention.

FIG. 16 is a flowchart showing an image sensing module manufacturing method according to a second embodiment of the present invention. Similar to the embodiment shown in FIG. 6, the embodiment shown in FIG. 16 also has Step S10 and Step S12. However, there is difference between the embodiments shown in FIG. 6 and FIG. 16. In the embodiment of FIG. 16, Step S18 and Step S20 are undertaken in sequence after Step S12. In Step S12 of FIG. 16, a plurality of lenses 52, 54 and 56 is placed in each barrel 502, as shown in FIG. 8. After the lenses 52, 54 and 56 have been placed in each barrel 502, a transparent protection layer 58 is formed on one side of the mold 50 to cover each second hole 5024 of each barrel 502, as shown in FIG. 9. In one embodiment, the transparent protection layer 58 may be but is not limited to be a piece of flat glass. The flat glass may be a piece of glass coated with an anti-reflection film. In another embodiment, the transparent protection layer 58 may be omitted.

Figure 17:
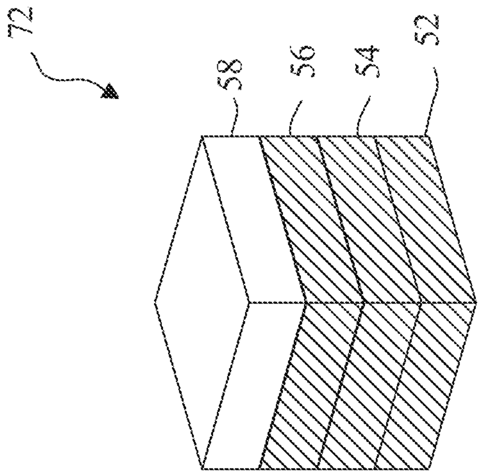
FIG. 17 is a diagram schematically showing a lens module.

In the embodiment shown in FIG. 16, after the transparent protection layer 58 has been formed, the process proceeds to Step S18. In Step S18, perform cutting according to the alignment marks 504 to obtain a plurality of lens modules 72, as shown in FIG. 17. In the embodiment shown in FIG. 16, after cutting is completed, the process proceeds to Step S20. In Step S20, install an image sensor 60 on each lens module 72 or adhesively secure an image sensor 60 to each lens module 72 to form an image sensing module 70, as shown in FIG. 11. In one embodiment, before the image sensor 60 is adhesively secured to the lens module 72, the image quality may be verified in an auto-alignment (AA) method; after the image quality is confirmed, the image sensor 60 is adhesively secured to the lens module 72. Then, cover or coat the cut surfaces of the image sensing module 70 with a light-shielding layer 62 to prevent stray light from entering the image sensing module 70 lest image quality be affected, as shown in FIG. 12.

In Steps S16 and S18 of FIG. 16, while the mold 50 is cut, a certain thickness of the residual material (or called the residual barrel material) is preserved to function as the light-shielding layer to prevent stray light from entering the image sensing module 70 lest image quality be affected. Thus, the step of cover or coat the cut surfaces of the image sensing module 70 with the light-shielding layer 62 may be omitted.

Figure 18:
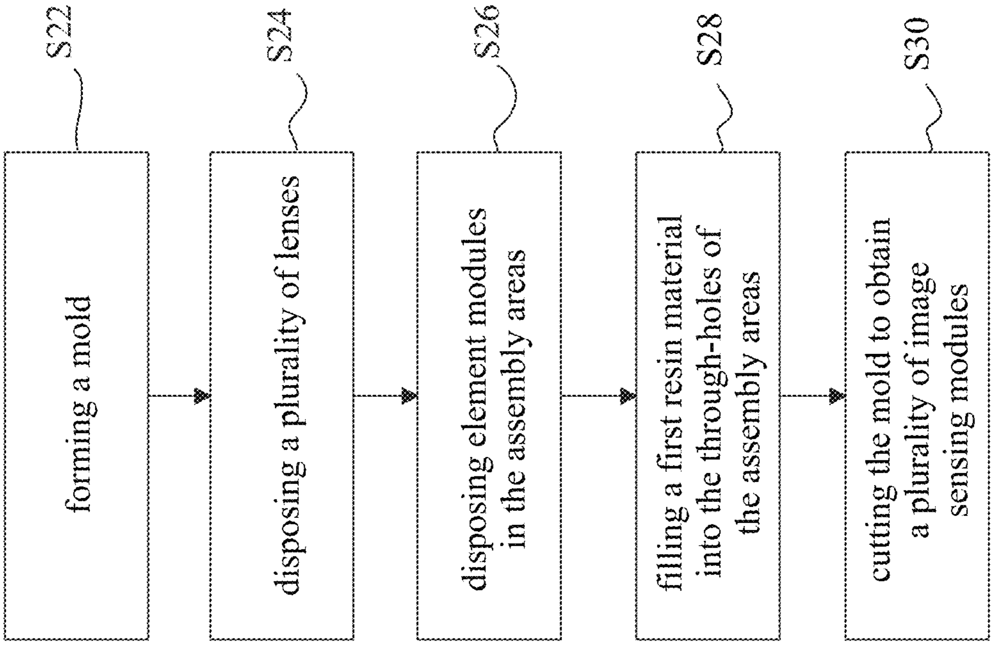
FIG. 18 is a flowchart showing an image sensing module manufacturing method according to a third embodiment of the present invention.
Figure 19:
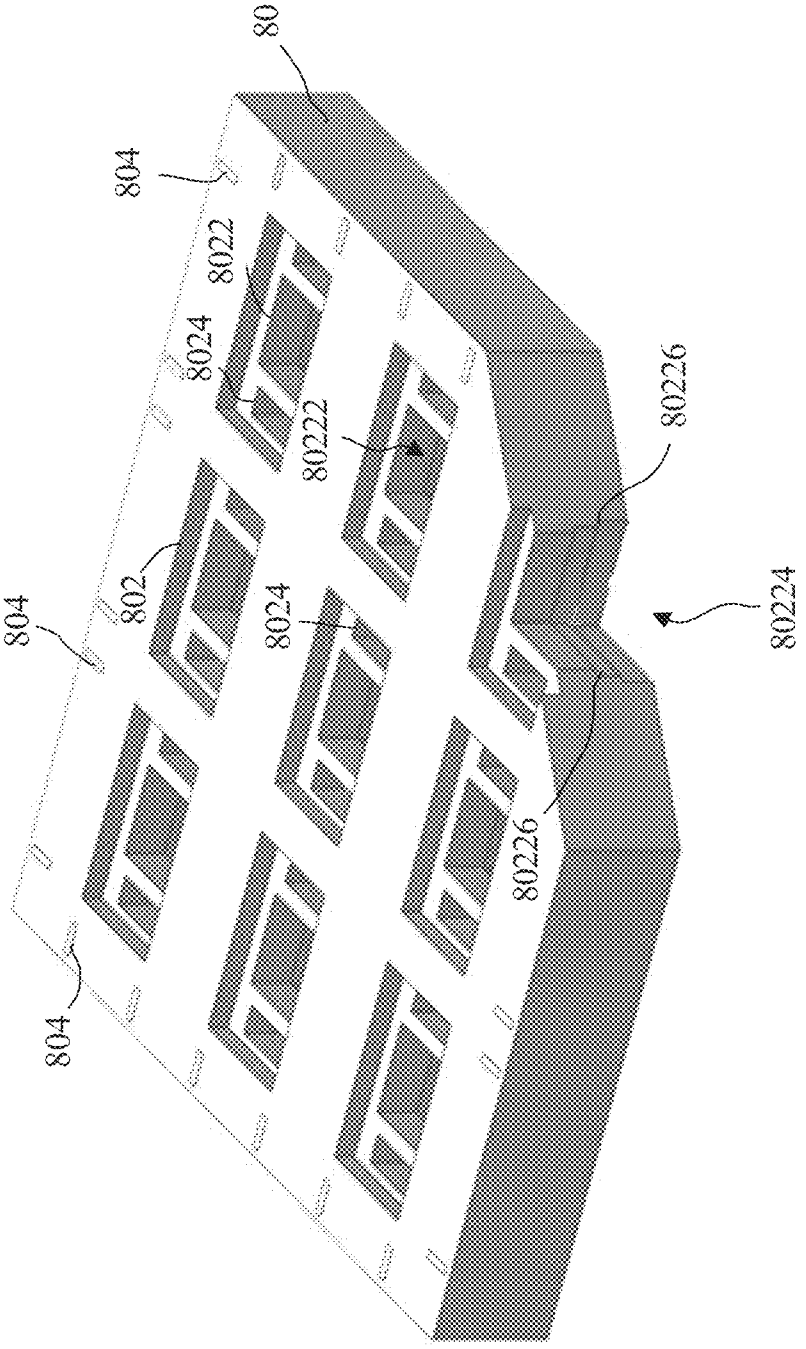
FIG. 19 is a perspective view schematically showing a third embodiment of the mold.

FIG. 18 is a flowchart showing an image sensing module manufacturing method according to a third embodiment of the present invention. In Step S22 of FIG. 18, the image sensing module manufacturing method of the present invention forms a mold 80 firstly. The mold 80 may be but is not limited to be produced in a mold-injection method. Refer to FIG. 19. The mold 80 includes a plurality of assembly areas 802. Each assembly area 802 has a barrel 8022 and two through-holes 8024. The barrel 8022 does not interconnect with the through-holes 8024. In one embodiment, the number of the through-holes 8024 in the assembly area 802 may be varied according to requirement. The barrel 8022 has a first hole 80222 and a second hole 80224, which are opposite to each other and interconnect with each other. The barrel 8022 also has a plurality of support structures 80226 thereinside. The present invention does not particularly limit the shape of the barrel 8022 but allows the shape of the barrel 8022 to be a regular shape (such as a circular or rectangular shape) or an irregular shape. The mold 80 also has alignment marks 804, which are used in the following cutting process for alignment.

Figure 20:
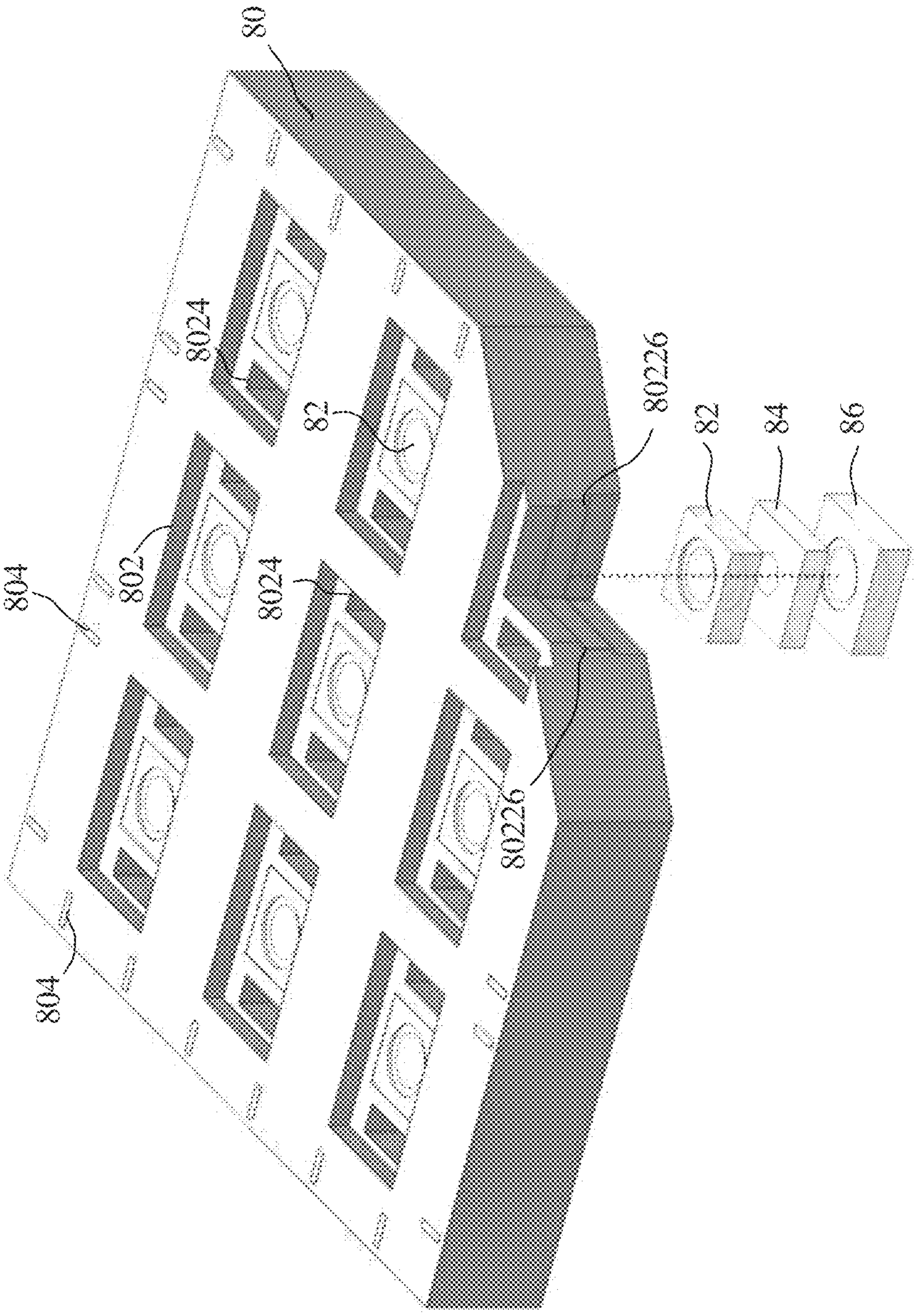
FIG. 20 is a perspective view schematically showing that lenses are disposed inside the mold shown in FIG. 19.

Refer to FIG. 20. Next, in Step S24, dispose a plurality of lenses 82, 84 and 86 inside the barrel 8022, and use a resin material to adhesively secure the lenses 82, 84 and 86 inside the barrel 8022. The resin material may be applied to the imaging areas and/or non-imaging areas (not shown in the drawings) of the lenses 82, 84 and 86. The lenses 82, 84 and 86 may respectively have different sizes and may be adhesively secured to different support structures 80226. In the embodiment, three lenses are placed in each barrel 8022. However, the present invention does not limit the number of the lenses in each barrel 8022. The number of the lenses in each barrel may be varied according to requirement.

Figure 21:
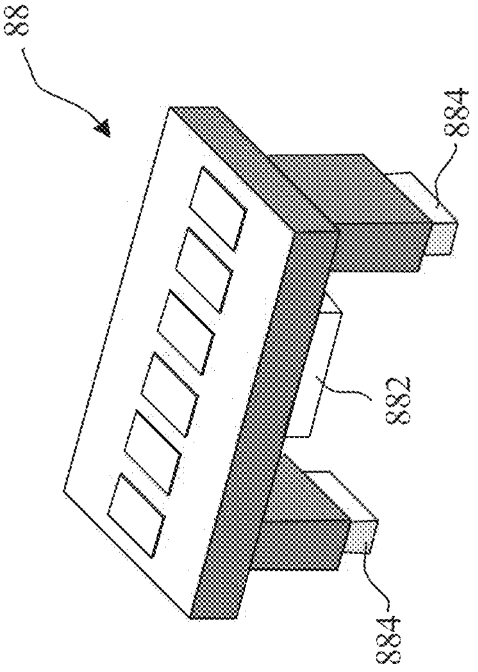
FIG. 21 is a perspective view schematically showing an element module.
Figure 22:
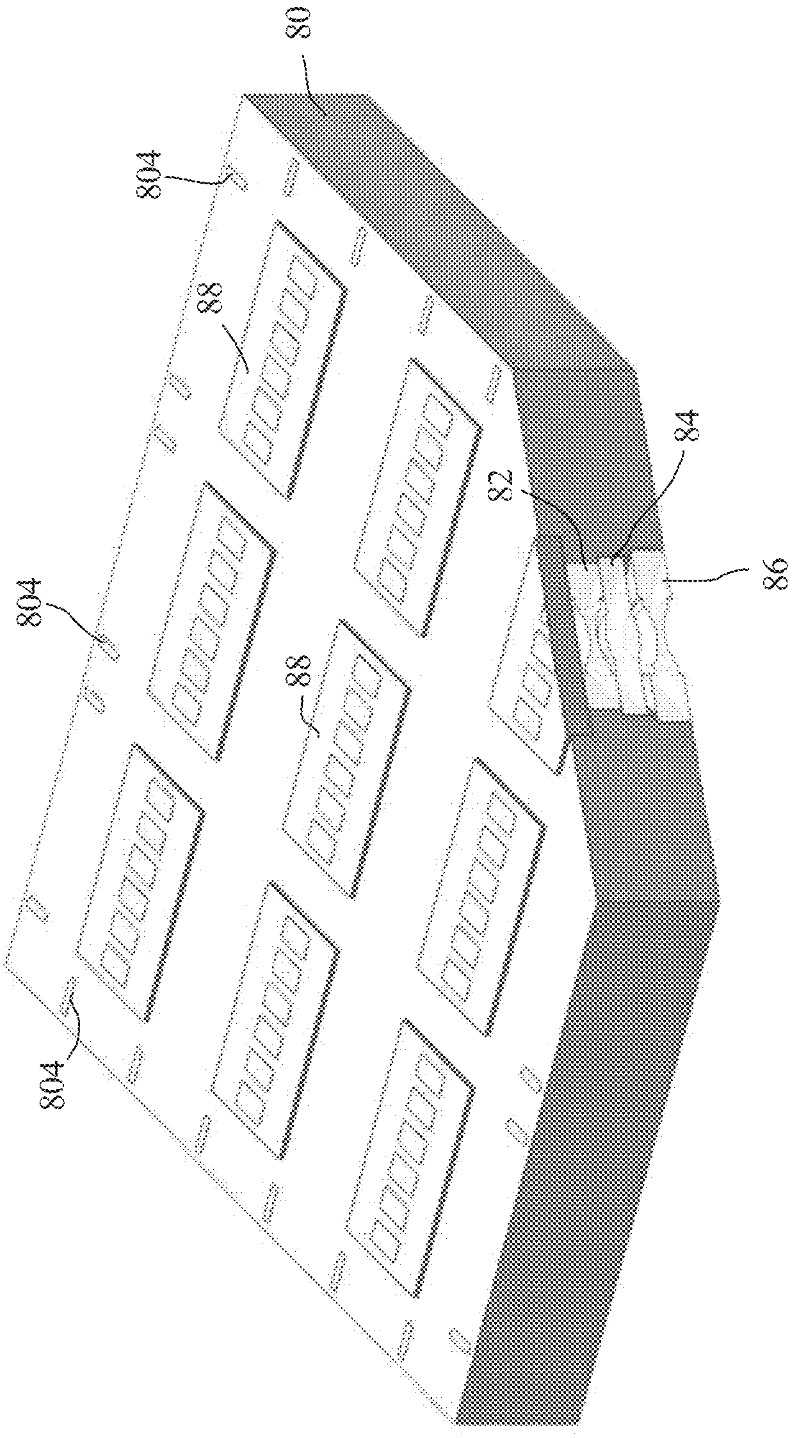
FIG. 22 is a perspective view schematically showing that element modules are disposed inside assembly areas.

Refer to FIG. 21 and FIG. 22. After the lenses 82, 84 and 86 have been installed, the process proceeds to Step S26 of FIG. 18. In Step S26, dispose an element module 88 having an image sensor 882 and light-emitting elements 884 in each assembly area 802. In one embodiment, the light-emitting element 884 may be a light-emitting diode (LED). The distance between the image sensor 882 and the light-emitting element 884 is greater than or equal to the distance between the barrel 8022 and the through-hole 8024. The image sensor 882 is placed in the region of the barrel 8022, and the light-emitting elements 884 are placed in the region of the through-hole 8024. After the element module 88 has been fully attached to the assembly area 802, a resin material is used to adhesively secure the element module 88. In one embodiment, Step S24 and Step S26 in FIG. 18 may be undertaken in a reserve sequence or untaken simultaneously.

Figure 23:
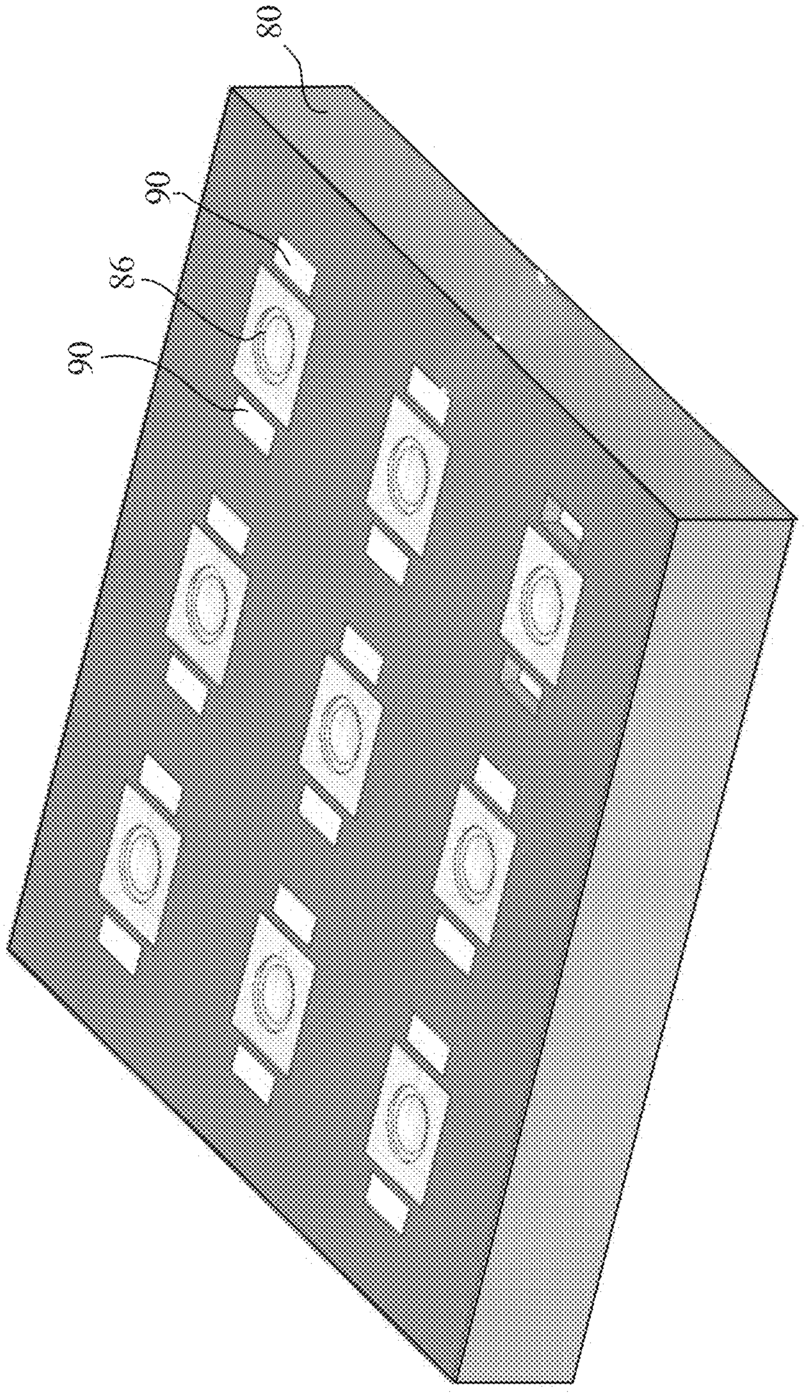
FIG. 23 is a perspective view schematically showing that a first resin material is filled into assembly areas.

After the element module 88 has been installed, the process proceeds to Step S28 of FIG. 18. Refer to FIG. 23. In Step S28, fill a first resin material 90 into the through-holes 8024 of each assembly area 802 to cover the light-emitting elements 884. The first resin material 90 is a transparent resin material, which protects the light-emitting elements 884 without blocking the light of the light-emitting elements 884.

Figure 24:
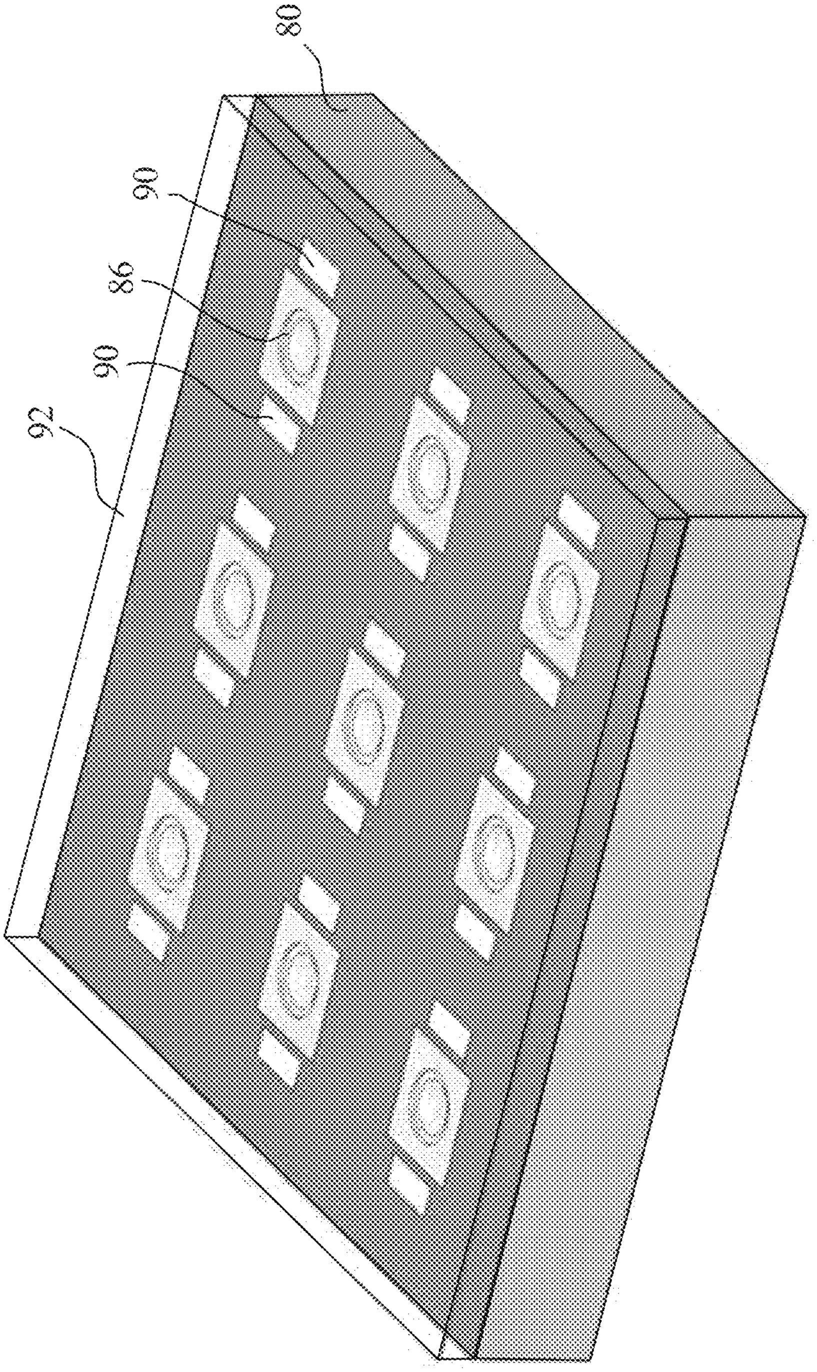
FIG. 24 is a perspective view schematically showing that a transparent protection layer is formed on the mold.

Refer to FIG. 24. After the first resin material 90 is cured, a transparent protection layer 92 is formed on one side of the mold 80 to protect the surface. In one embodiment, the transparent protection layer 92 may be but is not limited to be a piece of flat glass. The flat glass may be a piece of glass coated with an anti-reflection film. In another embodiment, the transparent protection layer 92 may be omitted.

Figure 25:
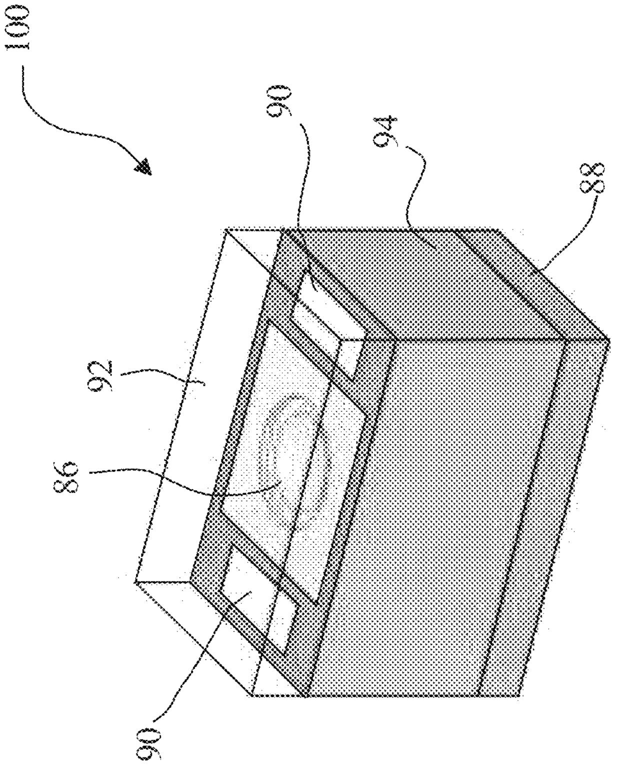
FIG. 25 is a perspective view schematically showing an image sensing module having residual barrel material.

Refer to FIG. 25. After the transparent protection layer 92 is formed, the process proceeds to Step S30 of FIG. 18. In Step S30, perform cutting according to the alignment marks 804 to obtain a plurality of image sensing modules 100. Each image module 100 includes an element module 88. In the embodiment, there has been the residual barrel material 94 to shield light for the image sensor 882 and the light-emitting elements 884. Therefore, it is unnecessary to coat an additional light-shielding layer. In one embodiment, if there is no residual barrel material 94 to shield light for the image sensing module 100, a light-shielding layer may be coated on the cut surface to prevent stray light from entering the image sensing module 100 lest image quality be affected.

In one embodiment, similar to the mold 50 in FIG. 15, the mold 80 in FIG. 19 may also have a gate 66 and a runner 68. The resin material may be filled into the plurality of barrels 8022 through the gate 66 and the runner 68 to adhesively secure the lenses 82, 84 and 86 inside the barrels 8022.

Figure 26:
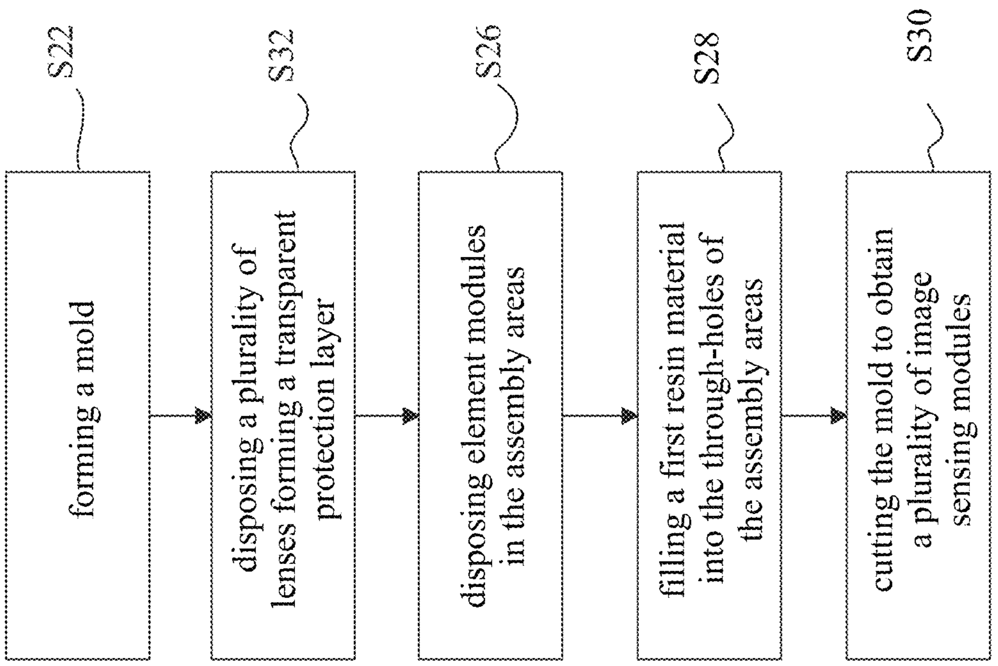
FIG. 26 is a flowchart showing an image sensing module manufacturing method according to a fourth embodiment of the present invention.
Figure 27:
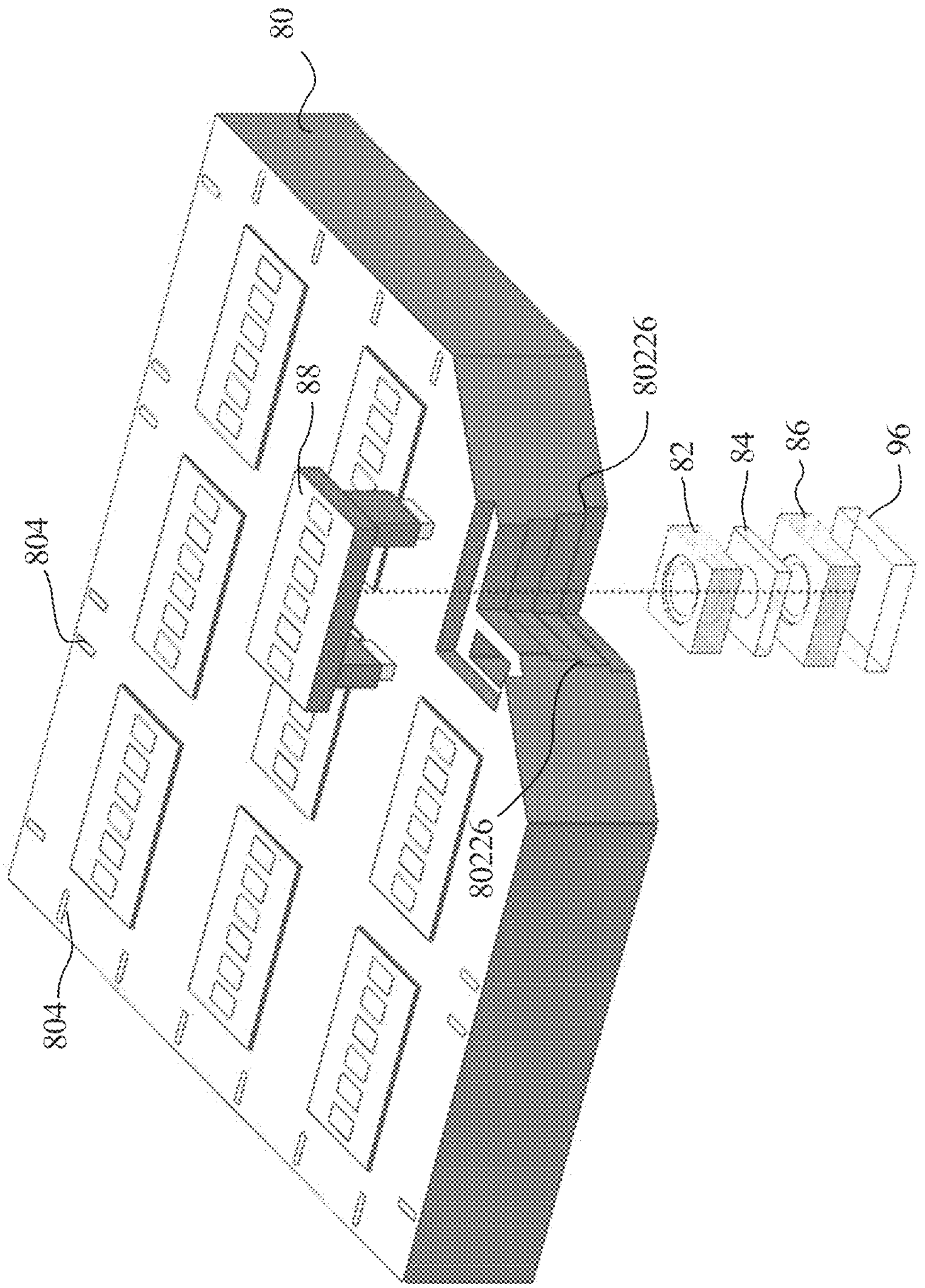
FIG. 27 is a perspective view schematically showing lenses and element modules are disposed inside the mold.
Figure 28:
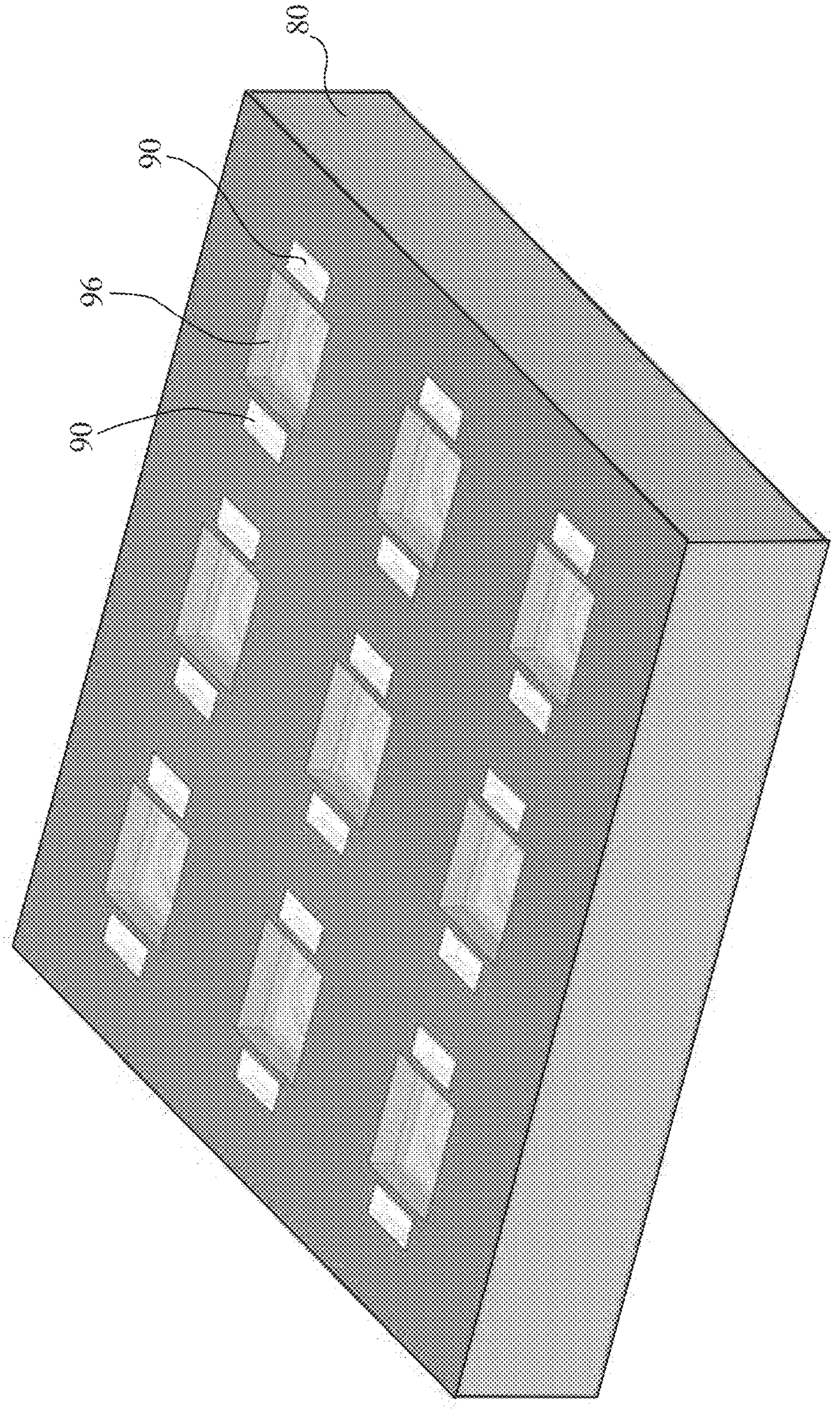
FIG. 28 is a perspective view schematically showing a first resin material is filled into the through-holes of assembly areas.
Figure 29:
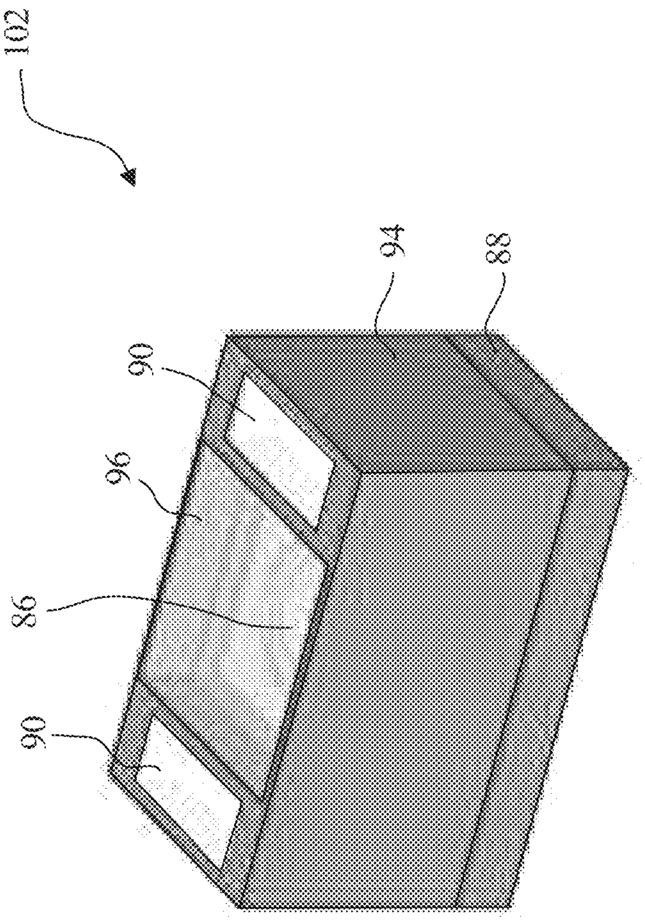
FIG. 29 is a perspective view schematically showing an image sensing module having residual barrel material.

FIG. 26 is a flowchart showing an image sensing module manufacturing method according to a fourth embodiment of the present invention. The method of FIG. 26 is almost the same as the method of FIG. 18. The method of FIG. 26 is different from the method of FIG. 18 in that the method of FIG. 26 uses Step S32 to replace Step S24 of FIG. 18. In the method of FIG. 26, undertake Step S22 firstly to form a mold 80, as shown in FIG. 19. Next, in Step S32, dispose a plurality of lenses 82, 84 and 86 and form a transparent protection layer 96, as shown in FIG. 27. A resin material may be used to adhesively secure lenses 82, 84 and 86 and the transparent protection layer 96 inside the barrel 8022. In one embodiment, similar to the mold 50 in FIG. 15, the mold 80 in FIG. 27 may also have a gate 66 and a runner 68. The resin material may be filled into the plurality of barrels 8022 through the gate 66 and the runner 68 to adhesively secure and the lenses 82, 84 and 86 and the transparent protection layer 96 inside the barrels 8022. After the lenses 82, 84 and 86 and the transparent protection layer 96 have been installed, the process proceeds to Step S26 of FIG. 26. In Step S26, dispose an element module 88, which has the image sensor 882 and the light-emitting elements 884, in each assembly area 802, as shown in FIG. 21 and FIG. 27. In one embodiment, Step S26 and Step S32 may be undertaken in a reverse sequence or undertaken simultaneously. After the element module 88 has been installed, the process proceeds to Step S28 of FIG. 26. In Step S28, fill a first resin material 90 into the through-holes 8024 of each assembly area 802 to cover the light-emitting elements 884, as shown in FIG. 28. After the first resin material 90 is cured, the process proceeds to Step S30 of FIG. 26. In Step S30, perform cutting according to the alignment marks 804 on the mold 80 to obtain a plurality of image sensing modules 102, as shown in FIG. 29. In the embodiment, there has been the residual barrel material 94 to shield light for the image sensor 882 and the light-emitting elements 884. Therefore, it is unnecessary to coat an additional light-shielding layer. In one embodiment, if there is no residual barrel material 94 to shield light for the image sensing module 102, the cut surface may be coated with a light-shielding layer to prevent stray light from entering the image sensing module 102 lest image quality be affected.

In one embodiment, Step S12 of FIG. 6 and FIG. 16 may replace Step S32 of FIG. 26. In such a situation, it is unnecessary to form the transparent protection layer 58 on one side of the mold 50.

The embodiments described above are only to exemplify the present invention but not to limit the scope of the present invention. Through making some modification or variation according to the technical contents disclosed in the specification and claims, any person having ordinary knowledge of the art should be able to generate equivalent embodiments without departing from the present invention. Further, the equivalent embodiments are to be also included by the scope of the present invention.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the appended claims.

What is claimed is:

1. An image sensing module manufacturing method, comprising

Step A: forming a mold, wherein the mold includes a plurality of barrels, and each barrel has a first hole and a second hole, which are opposite to each other and interconnect with each other;

Step B: disposing a plurality of lenses in each of the barrels;

Step C: installing an image sensor in the first hole of each barrel, wherein the image sensor is a chip-scale-package element; the plurality of lenses is used to focus light on the image sensor; and Step D: cutting the mold to obtain a plurality of image sensing modules, wherein each image sensing module includes the image sensor.

2. The image sensing module manufacturing method according to claim 1, further comprising a step: forming a transparent protection layer on one side of the mold to cover the second hole of each barrel after Step B and before Step D.

3. The image sensing module manufacturing method according to claim 1, wherein Step B further includes a step: placing a transparent protection layer in each barrel to cover the second hole of each barrel.

4. The image sensing module manufacturing method according to claim 1, further comprising a step: covering cut faces of each image sensing module with a light-shielding layer.

5. The image sensing module manufacturing method according to claim 1, wherein in Step D, while the mold is cut, a residual barrel material is preserved in a peripheral of the plurality of lenses to function as a light-shielding layer.

6. The image sensing module manufacturing method according to claim 1, wherein Step B further includes a step: using a resin material to adhesively secure the plurality of lenses inside each of the barrels.

7. The image sensing module manufacturing method according to claim 1, wherein Step A further includes a step: forming a gate on a surface of the mold;

a step: forming a runner inside the mold, wherein the runner is connected with the gate; and a step: forming the plurality of barrels, wherein the runner is connected with the plurality of barrels.

8. The image sensing module manufacturing method according to claim 7, wherein Step B further includes a step: filling a resin material into the plurality of barrels through the gate and the runner to adhesively secure the plurality of lenses inside each of the barrels.

9. An image sensing module manufacturing method, comprising

Step A: forming a mold, wherein the mold includes a plurality of barrels, and each barrel has a first hole and a second hole, which are opposite to each other and interconnect with each other;

Step B: disposing a plurality of lenses in each of the barrels;

Step C: cutting the mold to obtain a plurality of lens modules; and

Step D: installing an image sensor in each of the lens modules to form an image sensing module, wherein the image sensor is a chip-scale-package element; the plurality of lenses is used to focus light on the image sensor.

10. The image sensing module manufacturing method according to claim 9, further comprising a step: forming a transparent protection layer on one side of the mold to cover the second hole of each barrel after Step B and before Step C.

11. The image sensing module manufacturing method according to claim 9, wherein Step B further includes a step: placing a transparent protection layer in each barrel to cover the second hole of each barrel.

12. The image sensing module manufacturing method according to claim 9, further comprising a step: covering cut faces of each image sensing module with a light-shielding layer.

13. The image sensing module manufacturing method according to claim 9, wherein in Step C, while the mold is cut, a residual barrel material is preserved in a peripheral of the plurality of lenses to function as a light-shielding layer.

14. The image sensing module manufacturing method according to claim 9, wherein Step B further includes a step: using a resin material to adhesively secure the plurality of lenses inside each of the barrels.

15. The image sensing module manufacturing method according to claim 9, wherein Step A further includes a step: forming a gate on a surface of the mold;

a step: forming a runner inside the mold, wherein the runner is connected with the gate; and a step: forming the plurality of barrels, wherein the runner is connected with the plurality of barrels.

16. The image sensing module manufacturing method according to claim 15, wherein Step B further includes a step: filling a resin material into the plurality of barrels through the gate and the runner to adhesively secure the plurality of lenses inside each of the barrels.

17. An image sensing module manufacturing method, comprising

Step A: forming a mold, wherein the mold includes a plurality of assembly areas; each assembly area has a barrel and a through-hole; each barrel has a first hole and a second hole, which are opposite to each other and interconnect with each other;

Step B: disposing a plurality of lenses in each of the barrels;

Step C: disposing an element module in each of the assembly areas, wherein the element module includes an image sensor and a light-emitting element; the image sensor is a chip-scale-package element and disposed inside the first hole; the light-emitting element is disposed inside the through-hole; the plurality of lenses is used to focus light on the image sensor;

Step D: filling a first resin material into the through-hole of each assembly area to cover the light-emitting element, wherein the first resin material is a transparent resin material; and Step E: cutting the mold to obtain a plurality of image sensing modules, wherein each image sensing module includes the element module.

18. The image sensing module manufacturing method according to claim 17, further comprising a step: forming a transparent protection layer on one side of the mold to cover the second hole of each barrel after Step D and before Step E.

19. The image sensing module manufacturing method according to claim 17, wherein Step B further includes a step: placing a transparent protection layer in each barrel to cover the second hole of each barrel.

20. The image sensing module manufacturing method according to claim 17, wherein Step B further includes a step: using a second resin material to adhesively secure the plurality of lenses inside each of the barrels.

21. The image sensing module manufacturing method according to claim 17, wherein Step A further includes a step: forming a gate on a surface of the mold;

a step: forming a runner inside the mold, wherein the runner is connected with the gate; and a step: forming the barrel and the through-hole in each assembly area, wherein the runner is connected with the barrel of each assembly area.

22. The image sensing module manufacturing method according to claim 21, wherein Step B further includes a step: filling a second resin material into the plurality of barrels through the gate and the runner to adhesively secure the plurality of lenses inside each of the barrels; the second resin material is a transparent resin material.

23. The image sensing module manufacturing method according to claim 21, further comprising a step: covering cut faces of each image sensing module with a light-shielding layer.

24. The image sensing module manufacturing method according to claim 21, wherein in Step E, while the mold is cut, a residual barrel material is preserved in a peripheral of the plurality of lenses to function as a light-shielding layer.

* * * * *